(12) United States Patent
Noh et al.

(10) Patent No.: US 12,305,778 B2
(45) Date of Patent: May 20, 2025

(54) SEMICONDUCTOR GAS PIPE FITTING FASTENER

(71) Applicant: DK-LOK CORPORATION, Gimhae-si (KR)

(72) Inventors: Eunsik Noh, Gimhae-si (KR); Sunryong Lee, Hwaseong-si (KR)

(73) Assignee: DK-LOK CORPORATION, Gimhae-si (KR)

( * ) Notice: Subject to any disclaimer, the term of this patent is extended or adjusted under 35 U.S.C. 154(b) by 0 days.

(21) Appl. No.: 18/704,273

(22) PCT Filed: Aug. 17, 2022

(86) PCT No.: PCT/KR2022/012294
§ 371 (c)(1),
(2) Date: Apr. 24, 2024

(87) PCT Pub. No.: WO2023/075106
PCT Pub. Date: May 4, 2023

(65) Prior Publication Data
US 2024/0418303 A1    Dec. 19, 2024

(30) Foreign Application Priority Data

Oct. 29, 2021   (KR) .................. 10-2021-0147185

(51) Int. Cl.
*F16L 19/02*      (2006.01)
*F16L 19/00*      (2006.01)
*F16L 19/025*     (2006.01)

(52) U.S. Cl.
CPC ......... *F16L 19/0218* (2013.01); *F16L 19/005* (2013.01); *F16L 19/025* (2013.01); *F16L 2201/10* (2013.01)

(58) Field of Classification Search
CPC ... F16L 19/0231; F16L 19/00; F16L 19/0212; F16L 19/0218; F16L 19/005;
(Continued)

(56) References Cited

U.S. PATENT DOCUMENTS 2,752,579 A  *  6/1956  Caldwell ............... F16L 25/023
                                                    285/48
3,123,337 A  *  3/1964  Peras .................. F16L 19/0212
                                                    137/625.33
(Continued)

FOREIGN PATENT DOCUMENTS

| JP | 2008-216156 A | 9/2008 |
| JP | 2017-106562 A | 6/2017 |
| KR | 10-1992086 B1 | 6/2019 |

*Primary Examiner* — Aaron M Dunwoody
(74) *Attorney, Agent, or Firm* — Heedong Chae; Lucem, PC

(57) ABSTRACT

A semiconductor gas pipe fitting fastener is disclosed. The semiconductor gas pipe fitting fastener of the present disclosure includes: a female fitting member connected to a first pipe through which gas that is used in a semiconductor process flows; a male fitting member connected with the female fitting member by being connected to a second pipe opposite to the first pipe; a female nut member supporting the female fitting member therein; a male nut member supporting the male fitting member therein and configured to connect the female fitting member and the male fitting member by being coupled to the female nut member; and a gasket member supported on a side by the female fitting member, supported on another side by the male fitting member, and configured to prevent leakage of gas from the female fitting member and the male fitting member.

3 Claims, 4 Drawing Sheets

(58) Field of Classification Search
CPC ....... F16L 19/025; F16L 23/16; F16L 23/162; F16L 23/167; F16L 25/023; F16L 47/04; F16L 49/06; F16L 2201/10; H01L 21/67017
See application file for complete search history.

(56) References Cited

U.S. PATENT DOCUMENTS

| | | | | |
|---|---|---|---|---|
| 3,521,910 | A * | 7/1970 | Callahan, Jr. ....... | F16L 19/0218 277/330 |
| 5,308,124 | A * | 5/1994 | Yamaji .................... | F16B 39/24 285/422 |
| 5,673,946 | A * | 10/1997 | Barber ................ | F16L 19/0212 285/379 |
| 5,681,064 | A * | 10/1997 | Aldridge ............. | F16L 19/0212 285/379 |
| 6,145,888 | A * | 11/2000 | Ohmi .................... | F16L 19/025 285/379 |
| 6,318,766 | B1 * | 11/2001 | Babuder ............. | F16L 19/0218 277/609 |
| 10,144,119 | B2 * | 12/2018 | Hylbert ............... | B25B 23/1425 |
| 10,890,282 | B2 * | 1/2021 | Sneh ................... | F16L 19/0218 |
| 2001/0040378 | A1 * | 11/2001 | Babuder ............. | F16L 19/0218 285/328 |
| 2004/0160018 | A1 | 8/2004 | Dupont et al. | |
| 2014/0300106 | A1 * | 10/2014 | Kim ..................... | F16L 19/025 285/354 |
| 2017/0120429 | A1 * | 5/2017 | Hylbert ................ | F16L 19/025 |

* cited by examiner

SEMICONDUCTOR GAS PIPE FITTING FASTENER

CROSS REFERENCE TO RELATED APPLICATION

The present application claims priority to Korean Patent Applications No. 10-2021-0147185, filed Oct. 29, 2021 the entire contents of which are incorporated herein for all purposes by this reference.

BACKGROUND

Technical Field

The present disclosure relates to a fitting fastener and, in more detail, a semiconductor gas pipe fitting fastener that is used to connect gas pipes that are used in the manufacturing process of semiconductors.

Description of the Related Art

In general, the process of producing semiconductors is implemented, in a broad meaning, by repeating several times deposition, n injection, photo lithography, etching, cleaning, etc.

Processes that require gas of the above processes use gas in a plasma state, that is, an ionized state, and various gases such as Ar, $SiH_4$, $N_2O$, $PH_3$, $SF_6$, Cl, $O_2$ are used. The manufacturing costs of most of these gases are very high, and gases that have a fatal impact on a human body are also included in these gases.

Dual face connection-type fitting is applied to pipes for flow of such gases. The connection type of such fitting does not cause the problem of accumulation of foreign substances or stagnation of remaining gas due to a bolt trap structure in comparison to a hermetic connection type that threads pipes and is used in common industrial pipeline facilities, so the connection type is generally used for the pipelines of high-tech industrial facilities that require high-purity liquid or gas.

A face seal fitting assembly is a component included in a face seal fitting and is composed of a male face seal connector and a female face seal connector, in which the male face seal connector includes a male nut having a difference in that it has a bolt shape on the outer surface because threads are formed on the outer circumferential surface but a through-hole for a surface machining member is disposed therein, and the female face seal connector includes a female nut having threads formed on the inner circumferential surface to be fastened to the male nut.

Meanwhile, existing face seal fitting assemblies have a defect that it is possible to know only whether a gasket is inserted but it is impossible to check over-fastening or non-fastening of nuts.

Further, since a male nut is supposed to be rotated when fastening, the application is limited, and when a male nut is rotated, leakage is generated, so it is prohibited.

Further, a female nut has to be manufactured along a gasket and a retainer so that the female nut is rotated, and I-marking is required for fastening, so a new reform measure is required.

The above description is the background for helping understand the present disclosure and does not means the related art well known in the art.

SUMMARY

Accordingly, an objective of the present disclosure is to provide a semiconductor gas pipe fitting fastener that makes it possible to check the material of a gasket through a color, can be fastened without leakage by rotating a female nut, as in a standard VCR type, makes it possible to check the work result from afar by showing a color on the female nut, makes it possible to check both of over-fastening and non-fastening, and does not require image marking when fastening.

According to an aspect of the present disclosure, there may be provided a semiconductor gas pipe fitting fastener that includes: a female fitting member connected to a first pipe through which gas that is used in a semiconductor process flows; a male fitting member connected with the female fitting member by being connected to a second pipe opposite to the first pipe; a female nut member supporting the female fitting member therein; a male nut member supporting the male fitting member therein and configured to connect the female fitting member and the male fitting member by being coupled to the female nut member; and a gasket member supported on a side by the female fitting member, supported on another side by the male fitting member, and configured to prevent leakage of gas from the female fitting member and the male fitting member, wherein the gasket member includes a protrusion of which a side is exposed outside the female nut member, a gasket indicator is disposed at the protrusion such that the exposed region of the protrusion is shown, and the gasket indicator is shown to correspond to a material of the gasket member, a gasket slot in which the gasket member is inserted is formed at the female nut member, a first indicator and a second indicator are disposed in a region of the female nut member in which the gasket slot is formed, and the first indicator and the second indicator are shown in different colors, whereby a fastening state of the female nut member is shown.

The gasket member may include: a gasket body having a gasket hole connected with the female fitting member and the male fitting member; a protrusion formed at the gasket body and having an end exposed outside the gasket slot; and the gasket indicator disposed at the protrusion.

The female nut member may include: a female nut body having the gasket slot; the first indicator disposed on a side of the female nut body on which the gasket slot is formed; and a second indicator disposed on another side of the female nut body on which the gasket slot is formed, and colored with a different color from the first indicator, and the semiconductor gas pipe fitting fastener may show a state before the female nut member and the male nut member are locked when the protrusion is positioned in the first indicator, and may show a state in which the female nut member and the male nut member have been fastened when the protrusion is positioned in the second indicator.

According to embodiments of the present disclosure, it is possible to check the material of a gasket through a color, implement fastening without leakage by rotating a female nut, as in a standard VCR type, check the work result from afar by showing a color on the female nut, and check both of over-fastening and non-fastening, and there is no need for image marking when fastening, so it is possible to reduce work time and it is impossible to fabricate a work result.

BRIEF DESCRIPTION OF THE DRAWINGS

The above and other objectives, features and other advantages of the present disclosure will be more clearly understood from the following detailed description when taken in conjunction with the accompanying drawings, in which.

DETAILED DESCRIPTION

Figure 1:
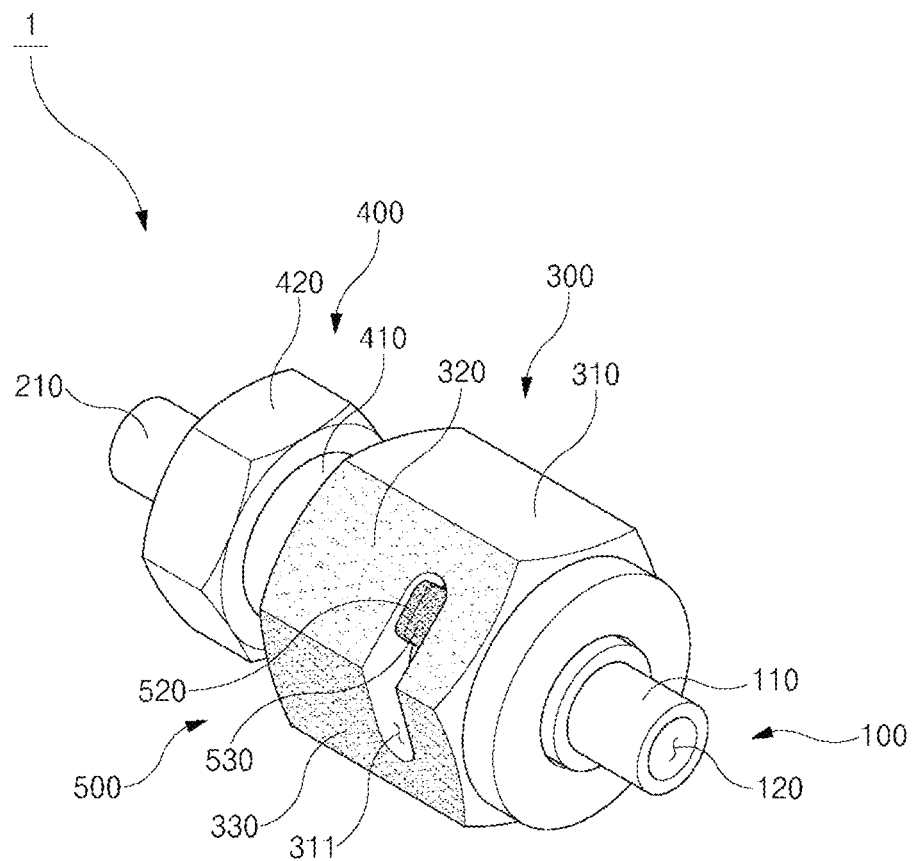
FIG. 1 is a view schematically showing a semiconductor gas pipe fitting fastener according to an embodiment of the present disclosure.

It is required to refer to the accompanying drawings exemplifying preferred embodiments of the present disclosure and the contents in the accompanying drawings to help sufficiently understand the present disclosure, the operational advantages of the present disclosure, and the objectives that are achieved by implementing the present disclosure.

The present disclosure will be described hereafter in detail by describing exemplary embodiments of the present disclosure with reference to the accompanying drawings. Like reference numerals given in the drawings indicate like components.

Figure 2:
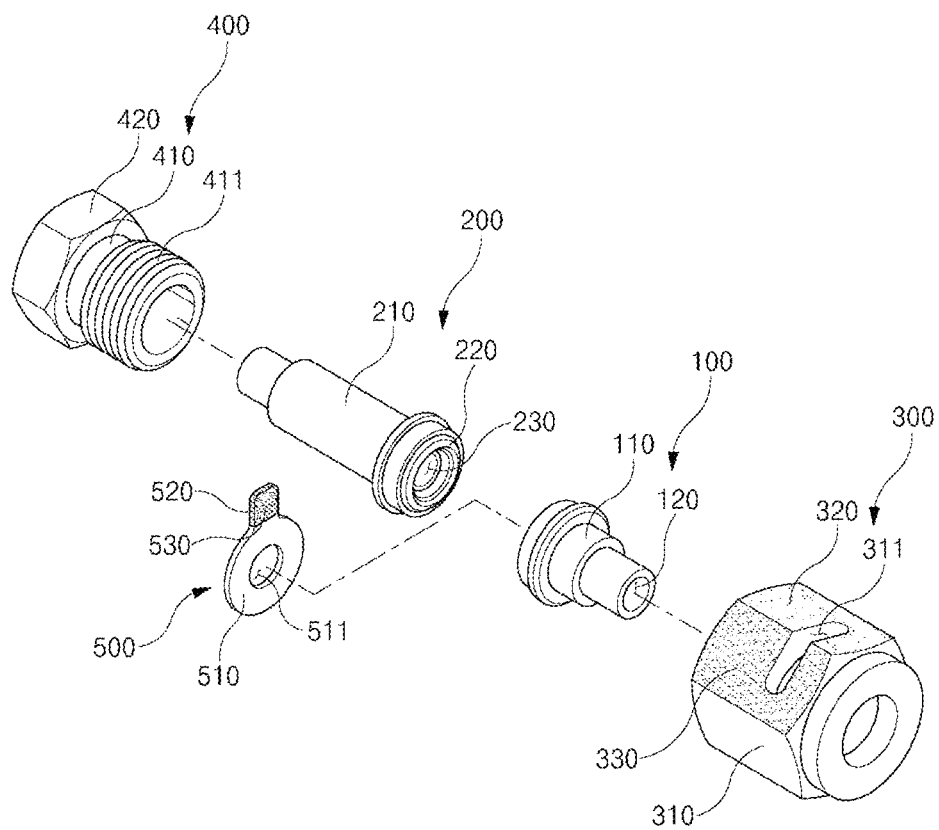
FIG. 2 is an exploded perspective view of FIG. 1.
Figure 3:
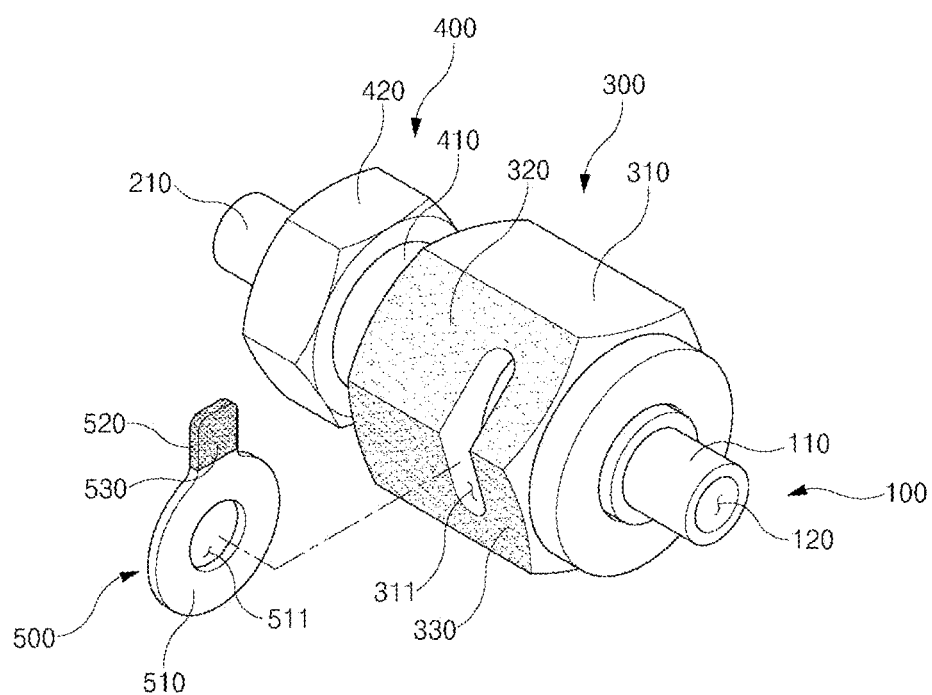
FIG. 3 is a view schematically showing the state in which a gasket member has been separated in FIG. 1.
Figures 4A, 4B:
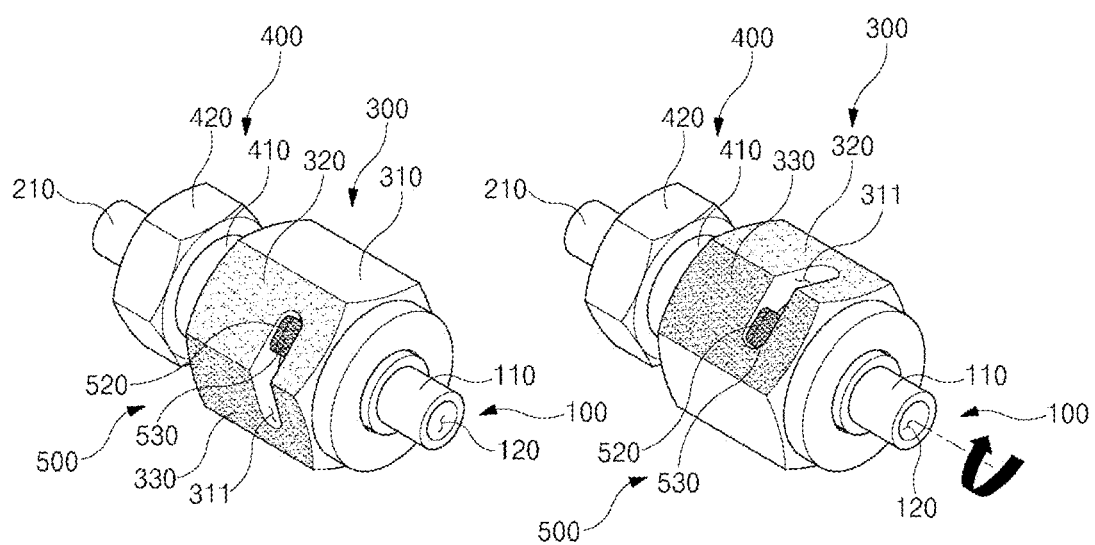
FIGS. 4A and 4B are views showing the use state of the embodiment.

FIG. 1 is a view schematically showing a semiconductor gas pipe fitting fastener according to an embodiment of the present disclosure, FIG. 2 is an exploded perspective view of FIG. 1, FIG. 3 is a view schematically showing the state in which a gasket member has been separated in FIG. 1, and FIGS. 4A and 4B are views showing the use state of the embodiment.

As shown in figures, a semiconductor gas pipe fitting fastener 1 according to the embodiment includes a female fitting member 100 that is connected to a first pipe through which gas that is used in a semiconductor process flows, a male fitting member 200 that is connected with the female fitting member 100 by being connected to a second pipe opposite to the first pipe, a female nut member 300 in which the female fitting member 100 is supported, a male nut member 400 in which the male fitting member 200 is supported and that connects the female fitting member 100 and the male fitting member 200 by being coupled to the female nut member 300, and a gasket member 500 of which a first side is supported by the female fitting member 100 and a second side is supported by the male nut member 400, thereby preventing leakage of gas from the female fitting member 100 and the male fitting member 200.

The female fitting member 100 is coupled to a first pipe through which gas that is used in a semiconductor process flows, and can be coupled to the male fitting member 200 with the gasket member 500 therebetween through coupling of the male nut member 400 and the female nut member 300.

In the embodiment, the female fitting member 100, as shown in FIG. 2, includes a female fitting body 110 and a first channel 120 formed in the female fitting body 110.

In the embodiment, multiple steps are formed on the outer wall of the female fitting body 110, so the female fitting body 110 can be locked and supported in a female nut body 310 of the female nut member 300.

The male fitting member 100 is disposed to fact the female fitting member 100, is coupled to a second pipe through which gas that is used in a semiconductor process flows, and can be coupled to the female fitting member 100 with the gasket member 500 therebetween through coupling of the male nut member 400 and the female nut member 300.

In the embodiment, the male fitting member 200, as shown in FIG. 2, includes a male fitting body 210 disposed to face the female fitting body 110, a gasket contact portion 220 formed on a side of the male fitting body 210 and being brought in contact with the gasket member 500, and a second channel 230 formed in the male fitting body 210.

The female nut member 300 is fastened to the male nut member 400, thereby being able to fix the positions of the female fitting member 100 and the male fitting member 200 with the gasket member 500 therebetween.

In the embodiment, the female nut member 300, as shown in FIG. 1, includes a female nut body 310 disposed at a position corresponding to the female fitting member 100 and coupled to the male nut body 410 of the male nut member 400, a first indicator 320 disposed on the outer surface of the female nut body 310 and showing the fastening position of the gasket member 500, and a second indicator 330 disposed on the outer surface of the female nut body 310 in contact with the first indicator 320, showing the fastening position of the gasket member 500, and colored in a different color from the first indicator 320.

A gasket slot 311 is formed at the female nut body 310 of the female nut member 300, as shown in FIG. 2, and the gasket member 500 can be inserted into the female nut body 310 through the gasket slot 311.

In the embodiment, the gasket slot 311, as shown in FIG. 2, may be formed at the female nut body 310 in the region in which the first indicator 320 and the second indicator 330 are disposed.

The first indicator 320 of the female nut member 300, for example, may be colored in red, thereby being able to guide a worker to easily check the position of the gasket member 500 from afar. In the embodiment, after the female nut member 300 is coupled to the male nut member 400, a protrusion 520 of the gasket member 500 may be disposed in the first indicator 320. That is, in the embodiment, after the female nut member 300 and the male nut member 400 are fastened, the protrusion 520 of the gasket member 500 may be disposed at the outermost edge of the gasket slot 311 formed at the first indicator 320.

The second indicator 330 of the female nut member 300, for example, may be colored in blue, thereby being able to guide a worker to easily check the position of the gasket member 500 from afar.

The male nut member 400 is fastened to the female nut member 300, thereby being able to fix the positions of the female fitting member 100 and the male fitting member 200 with the gasket member 500 therebetween.

In the embodiment, the male nut member 400, as shown in FIG. 2, includes a male nut body 410 having male nut threads 411 on the outer wall and a male nut head 420 disposed at a side of the male nut body 410 and provided as a fastening place of a fastening tool.

In the embodiment, the male nut body 410 is hollow, so gas for a semiconductor process can move through the male nut body 410, the male fitting body 210, the female fitting body 110, a gasket hole 511 of the gasket member 500, the female fitting body 110, and the female nut body 310.

The gasket member 500, as shown in FIG. 3, is inserted in the female nut body 310 through the gasket slot 311 of the female nut member 300, and a side of the gasket member 500 is supported by the female nut body 310, and the other side of the gasket member 500 is supported by the gasket contact portion 220 of the male fitting member 200, whereby leakage of gas from the female fitting member 100 and the male fitting member 200 can be prevented.

In the embodiment, the gasket member 500, as shown in FIG. 2, includes a gasket body 510 having a gasket hole 511 at the center, a protrusion 520 formed at the gasket body 510 and having a side exposed outside the gasket slot 311, and a gasket indicator 530 disposed at the protrusion 520 and showing the material of the gasket body 510 through a color.

In the embodiment, the gasket indicator 530 may be colored in a color, for example, yellow different from the first indicator 320 and the second indicator 330.

In the embodiment, when the female nut body 310 is fastened, the protrusion is locked to the female nut body 310 and rotated, so it is possible to check both of over-fastening and non-fastening of the female nut body 310.

Further, in the embodiment, it is possible to easily check the material of the gasket member 500 through the color shown at the gasket indicator 530.

As described above, according to the embodiment, it is possible to check the material of a gasket through a color, implement fastening without leakage by rotating a female nut, as in a standard VCR type, check the work result from afar by showing a color on the female nut, and check both of over-fastening and non-fastening, and there is no need for image marking when fastening, so it is possible to reduce work time and it is impossible to fabricate a work result.

The present disclosure is not limited to the embodiment described above and it is apparent to those skilled in the art that the present disclosure may be changed and modified in various ways without departing from the spirit and scope of the present disclosure. Accordingly, it should be noted that such changes and modifications are included in claims of the present disclosure.

What is claimed is:

1. A semiconductor gas pipe fitting fastener comprising:
    a female fitting member connected to a first pipe through which gas that is used in a semiconductor process flows;
    a male fitting member connected with the female fitting member by being connected to a second pipe opposite to the first pipe;
    a female nut member supporting the female fitting member therein;
    a male nut member supporting the male fitting member therein and configured to connect the female fitting member and the male fitting member by being coupled to the female nut member; and
    a gasket member supported on a side by the female fitting member, supported on another side by the male fitting member, and configured to prevent leakage of gas from the female fitting member and the male fitting member,
    wherein the gasket member includes a protrusion of which a side is exposed outside the female nut member,
    a gasket indicator is disposed at the protrusion such that the exposed region of the protrusion is shown, and the gasket indicator is shown to correspond to a material of the gasket member,
    a gasket slot in which the gasket member is inserted is formed at the female nut member,
    a first indicator and a second indicator are disposed in a region of the female nut member in which the gasket slot is formed, and
    the first indicator and the second indicator are shown in different colors, whereby a fastening state of the female nut member is shown.

2. The semiconductor gas pipe fitting fastener of claim 1, wherein the gasket member includes:
    a gasket body having a gasket hole connected with the female fitting member and the male fitting member;
    a protrusion formed at the gasket body and having an end exposed outside the gasket slot; and
    the gasket indicator disposed at the protrusion.

3. The semiconductor gas pipe fitting fastener of claim 1, wherein the female nut member includes:
    a female nut body having the gasket slot;
    the first indicator disposed on a side of the female nut body on which the gasket slot is formed; and
    a second indicator disposed on another side of the female nut body on which the gasket slot is formed, and colored with a different color from the first indicator, and
    the semiconductor gas pipe fitting fastener shows a state before the female nut member and the male nut member are locked when the protrusion is positioned in the first indicator, and shows a state in which the female nut member and the male nut member have been fastened when the protrusion is positioned in the second indicator.

* * * * *